US011275423B2

(12) United States Patent
Liepold et al.

(10) Patent No.: US 11,275,423 B2
(45) Date of Patent: *Mar. 15, 2022

(54) LOW-POWER TOUCH BUTTON SENSING SYSTEM

(71) Applicant: Cypress Semiconductor Corporation, San Jose, CA (US)

(72) Inventors: Carl Liepold, San Jose, CA (US); Hans Klein, Pleasanton, CA (US); Hans Van Antwerpen, Mountain View, CA (US); Adrian Woolley, Livermore, CA (US); David Wright, San Mateo, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 18 days.

This patent is subject to a terminal disclaimer.

(21) Appl. No.: 16/386,702

(22) Filed: Apr. 17, 2019

(65) Prior Publication Data

US 2019/0302865 A1  Oct. 3, 2019

Related U.S. Application Data

(63) Continuation of application No. 15/490,438, filed on Apr. 18, 2017, now Pat. No. 10,303,236, which is a (Continued)

(51) Int. Cl.
*G06F 1/32* (2019.01)
*G06F 1/3215* (2019.01)
(Continued)

(52) U.S. Cl.
CPC ............. *G06F 1/32* (2013.01); *G01R 27/26* (2013.01); *G06F 1/3215* (2013.01);
(Continued)

(58) Field of Classification Search
CPC ........ G06F 1/32; G06F 1/3234; G06F 1/3215; G06F 3/02
See application file for complete search history.

(56) References Cited

U.S. PATENT DOCUMENTS 5,590,343 A   12/1996  Bolan et al.
6,633,280 B1  10/2003  Matsumoto et al.
(Continued)

FOREIGN PATENT DOCUMENTS

CN   101131811 A   2/2008
CN   102111494 A   6/2011
(Continued)

OTHER PUBLICATIONS

IphoneHacks "How to Set Up and Start using you new iphone 5s" Sep. 20, 2013.*
(Continued)

*Primary Examiner* — Vincent H Tran

(57) ABSTRACT

Systems, apparatus, and methods measure a signal provided by a capacitance sensor, the signal indicative of a presence of an object proximate to the capacitance sensor. Responsive to measuring the signal, embodiments access control information in a memory to determine whether the signal is associated with a first qualifying event of the control information. Responsive to determining that the signal is associated with the first qualifying event, embodiments control a power consumption of a communication device.

20 Claims, 11 Drawing Sheets

Related U.S. Application Data continuation of application No. 14/971,728, filed on Dec. 16, 2015, now Pat. No. 9,652,015.

(60) Provisional application No. 62/175,856, filed on Jun. 15, 2015.

(51) Int. Cl.
| | | |
|---|---|---|
| *G06F 1/3231* | (2019.01) | |
| *G06F 1/3234* | (2019.01) | |
| *G06F 3/02* | (2006.01) | |
| *G01R 27/26* | (2006.01) | |
| *H03K 17/96* | (2006.01) | |

(52) U.S. Cl.
CPC .......... *G06F 1/3231* (2013.01); *G06F 1/3234* (2013.01); *G06F 3/02* (2013.01); *H03K 17/962* (2013.01); *Y02D 10/00* (2018.01)

(56) References Cited

U.S. PATENT DOCUMENTS

| | | | |
|---|---|---|---|
| 6,725,382 B1 * | 4/2004 | Thompson | G06F 21/34 340/5.54 |
| 6,760,850 B1 | 7/2004 | Atkinson et al. | |
| 6,996,732 B2 | 2/2006 | Kotlow et al. | |
| 7,308,611 B2 | 12/2007 | Booth | |
| 7,375,535 B1 | 5/2008 | Kutz et al. | |
| 7,755,111 B2 | 7/2010 | Byrn | |
| 8,373,493 B2 | 2/2013 | Chakrabarty et al. | |
| 8,541,926 B2 | 9/2013 | Pulskamp et al. | |
| 8,842,887 B2 * | 9/2014 | Beatson | H04L 9/3231 382/115 |
| 8,866,533 B2 | 10/2014 | Lee | |
| 9,092,221 B2 | 7/2015 | Lin et al. | |
| 9,134,864 B2 | 9/2015 | Tamura | |
| 9,430,024 B2 * | 8/2016 | Heo | G06F 1/3234 |
| 9,652,015 B2 * | 5/2017 | Liepold | G01R 27/26 |
| 9,690,352 B2 * | 6/2017 | Liang | G06F 1/3231 |
| 10,303,236 B2 * | 5/2019 | Liepold | G06F 1/3215 |
| 10,353,477 B2 * | 7/2019 | St. Clair | G06F 3/04883 |
| 2008/0048993 A1 | 2/2008 | Yano | |
| 2008/0168290 A1 * | 7/2008 | Jobs | G06F 3/04883 713/324 |
| 2010/0050002 A1 * | 2/2010 | Huang | G06F 1/3287 713/310 |
| 2010/0123581 A1 | 5/2010 | Hatfield et al. | |
| 2010/0235667 A1 * | 9/2010 | Mucignat | G06F 1/3203 713/323 |
| 2010/0302028 A1 * | 12/2010 | Desai | G06F 1/1626 340/539.3 |
| 2011/0043481 A1 | 2/2011 | Bruwer | |
| 2011/0050638 A1 * | 3/2011 | Lee | G06F 1/3203 345/174 |
| 2011/0159864 A1 | 6/2011 | Park et al. | |
| 2011/0246952 A1 | 10/2011 | Tsao | |
| 2011/0264928 A1 * | 10/2011 | Hinckley | G06F 1/169 713/300 |
| 2012/0191993 A1 * | 7/2012 | Drader | G09G 5/006 713/320 |
| 2012/0212240 A1 | 8/2012 | Young | |
| 2012/0268145 A1 | 10/2012 | Chandra et al. | |
| 2013/0054986 A1 | 2/2013 | Kim et al. | |
| 2013/0069672 A1 | 3/2013 | Pedersen et al. | |
| 2013/0109311 A1 | 5/2013 | Moosavi | |
| 2013/0139115 A1 * | 5/2013 | Thiruvillamalai | G06F 3/0416 715/863 |
| 2013/0141342 A1 | 6/2013 | Bokma et al. | |
| 2013/0154959 A1 * | 6/2013 | Lindsay | G06F 3/0488 345/173 |
| 2013/0222285 A1 * | 8/2013 | Lee | G06F 3/04883 345/173 |
| 2014/0001885 A1 | 1/2014 | Xiao et al. | |
| 2014/0022211 A1 * | 1/2014 | Karpin | G06F 3/04166 345/174 |
| 2014/0025973 A1 | 1/2014 | Schillings et al. | |
| 2014/0092031 A1 | 4/2014 | Schwartz et al. | |
| 2014/0111474 A1 | 4/2014 | Bytheway | |
| 2014/0289442 A1 | 9/2014 | Tong et al. | |
| 2015/0002451 A1 | 1/2015 | Um | |
| 2015/0017910 A1 * | 1/2015 | Li | H04B 5/0031 455/41.1 |
| 2015/0058651 A1 * | 2/2015 | Choi | G06F 3/04883 713/324 |
| 2015/0058810 A1 | 2/2015 | Chang | |
| 2015/0185901 A1 | 7/2015 | Hsu et al. | |
| 2016/0004384 A1 | 1/2016 | Sato | |

FOREIGN PATENT DOCUMENTS

| | | |
|---|---|---|
| CN | 102854966 A | 1/2013 |
| CN | 102037431 B | 8/2013 |
| CN | 203258794 U | 10/2013 |
| CN | 103430032 A | 12/2013 |
| WO | 2015044717 A1 | 4/2015 |

OTHER PUBLICATIONS

CNIPA Office Action for Application No. 201580071334.0 dated Feb. 21, 2020; 12 pages.
Abba, A. et al., "Improved Power Gating Technique for Leakage Power Reduction", Research Inventy: International Journal of Engineering and Science, Oct. 2014, pp. 5-10, vol. 4, Issue 10.
International Search Report for International Application No. PCT/US2015/066897 dated Feb. 23, 2016; 2 pages.
USPTO Notice of Allowance for U.S. Appl. No. 14/971,728 dated Feb. 14, 2017; 5 pages.
Search Report for "Low-Power Touch Button Sensing System", dated Oct. 2015, 20 pages.
SIPO Office Action for Application No. 2015800713340 dated Jan. 28, 2019; 17 pages.
USPTO Final Rejection for U.S. Appl. No. 14/971,728 dated Nov. 25, 2016; 18 pages.
USPTO Non-Final Rejection for U.S. Appl. No. 15/490,438 dated Sep. 14, 2018; 17 pages.
USPTO Non-Final Rejection for U.S. Appl. No. 14/971,728 dated Aug. 11, 2016; 27 pages.
USPTO Notice of Allowance for U.S. Appl. No. 15/490,438 dated Jan. 17, 2019; 5 pages.
Written Opinion of the International Searching Authority for International Application No. PCT/US2015/066897 dated Feb. 23, 2016; 8 pages.
SIPO Office Action for Application No. 2015800713340 dated Sep. 18, 2019; 17 pages.
CNIPA Office Action for Application No. 2015800713340 dated Jul. 22, 2020; 6 pages.

\* cited by examiner

LOW-POWER TOUCH BUTTON SENSING SYSTEM

RELATED APPLICATIONS

This application is a continuation application of U.S. Non-Provisional application Ser. No. 15/490,438, filed on Apr. 18, 2017, which claims the benefit of U.S. Non-Provisional application Ser. No. 14/971,728, filed on Dec. 16, 2015, now U.S. Pat. No. 9,652,015, issued on May 16, 2017, which claims the benefit of U.S. Provisional Application No. 62/175,856, filed on Jun. 15, 2015, all of which are hereby incorporated by reference herein in their entirety.

TECHNICAL FIELD

This disclosure relates to the field of sensing systems and, in particular, to a touch button sensing system.

BACKGROUND

Computing devices, such as notebook computers, personal data assistants (PDAs), mobile communication devices, portable entertainment devices (such as handheld video game devices, multimedia players, and the like), and set-top-boxes (such as digital cable boxes, digital video disc (DVD) players, and the like) may have user interface devices, which are also known as human interface devices (HID), that facilitate interaction between the user and the computing device. One type of user interface device that has become more common is a sensing system that operates by way of touch sensing, such as capacitance sensing. A sensing system, such as a capacitance sensing system, may include a processing device and one or more capacitive sense electrodes. The capacitance detected of the capacitive sense electrodes by a processing device may change as a function of the proximity of a touch object to the capacitive sense array.

BRIEF DESCRIPTION OF THE DRAWINGS

The present disclosure is illustrated by way of example, and not by way of limitation, in the figures of the accompanying drawings.

DETAILED DESCRIPTION

Figure 1:
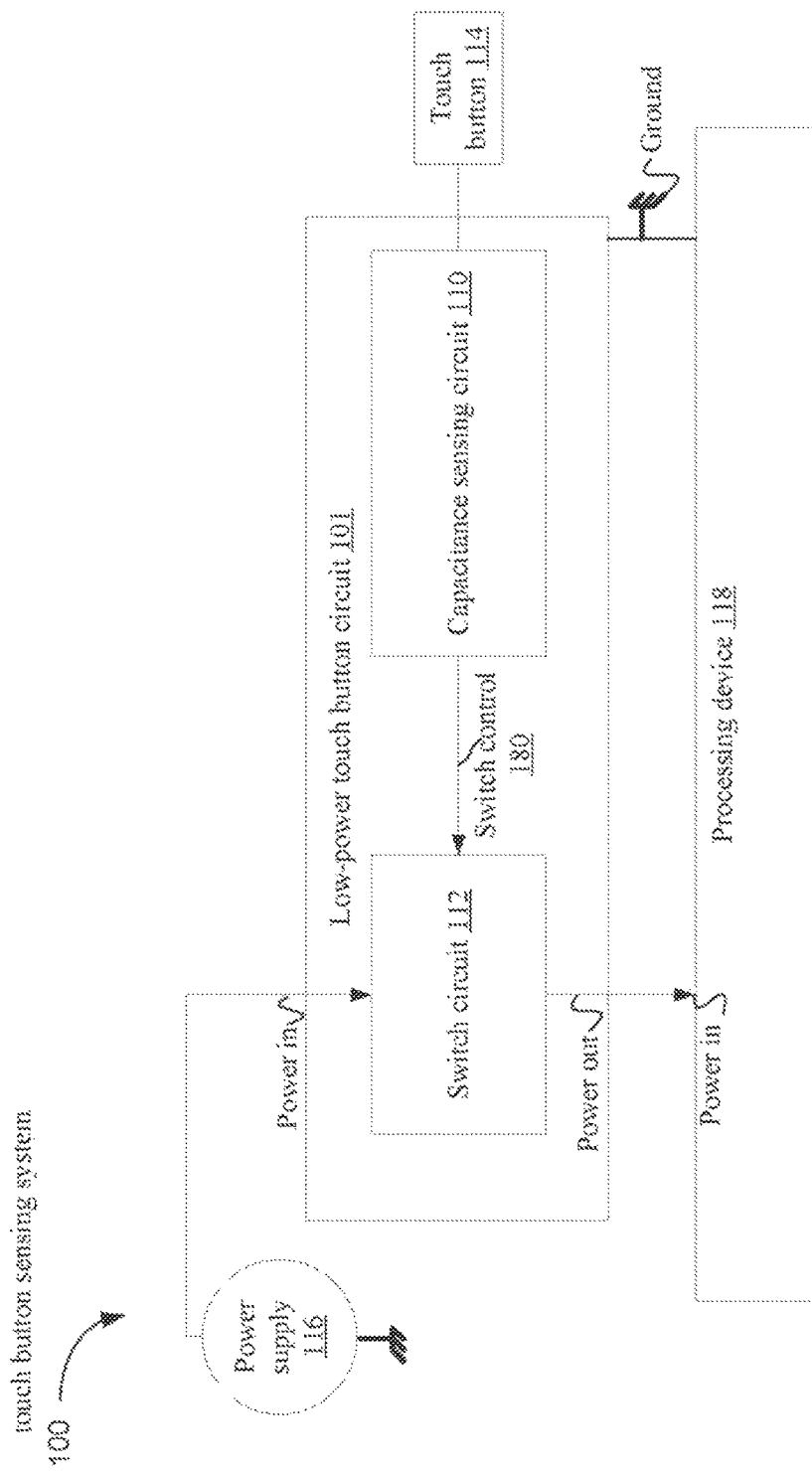
FIG. 1 is a block diagram illustrating a low-power touch button sensing system, according to an embodiment.

Electronic devices, such as processing devices, consume electric power. Power sources, such as batteries or wireless power signals, for electronic devices may have small and relatively finite capacities. Electronic devices using power sources with small and finite capacities may quickly consume power budgets and be rendered non-functional. Many power saving techniques such as low-power modes or sleep modes may be inappropriate, costly, or consume too much power.

The present disclosure addresses the above-mentioned and other deficiencies by detecting, by a capacitance sensing circuit, a presence of a touch object proximate to a touch button and controlling a switch circuit to connect a power supply to a processing device responsive to the detected touch. The capacitance sensing circuit consumes a small amount of current during operation.

In one embodiment, a capacitance sensing circuit receives an application of a power supply at power-up. For example, a capacitance sensing circuit may be disconnected from a power supply until, at power-up, a battery is applied to the capacitance sensing circuit. After the application of the power supply, the capacitance sensing circuit controls a switch circuit to connect the power supply to a processing device. The processing device receives power from the power supply and wakes up to perform a power-up routine including sending, via a control interface to the capacitance sensing circuit, control information to configure the capacitance sensing circuit. The capacitance sensing circuit is configured to respond to events, such as a presence of a touch object detected proximate to a touch button or a sequence of touches proximate to one or more touch buttons, by connecting or disconnecting the power supply and the processing device. Subsequent to receiving the control information, the capacitance circuit disconnects the power supply from the processing device and waits until an event, such as a detected touch, to reconnect the power supply and the processing device.

In another embodiment, the capacitance sensing circuit connects the power supply to the processing device independent of a detected touch. The capacitance sensing circuit may control the switch circuit to connect the power supply to the processing device responsive to a timer event. For example, the capacitance sensing circuit may include a delay timer circuit that counts clock pulses. After a predetermined number of clock pulses, the delay timer may signal to the capacitance sensing circuit to connect the power supply to the processing device.

In another embodiment, multiple touch buttons may be coupled together to form a composite button, for example when the capacitance sensing circuit is controlling the switch circuit to disconnect power from the processing device. The touch buttons may, for example, be capacitive buttons. The capacitance sensing circuit may measure a signal indicative of a single capacitance for the composite button to detect a presence of a touch object proximate to the composite button. The capacitance sensing circuit may be configured to connect the power supply to the processing device responsive to detecting a presence of a touch object proximate to the composite button. Alternatively, the capacitance sensing circuit may detect a presence of a touch object proximate to the composite button and in response, measure signals indicative of the individual capacitance of multiple touch buttons to detect the presence of a sequence of touches. For example, capacitance sensing circuit may couple multiple touch buttons together to detect a presence an initial touch, and then disconnect some or all of the touch buttons and measure them individually to identify which touch button or touch buttons have been touched. After the presence of the initial touch is detected, the capacitance sensing circuit measures the individual buttons to detect a sequence of touches. When a predetermined sequence of touches is detected, such as a sequence of touches representative of a password or the like, the capacitance sensing circuit connects the power supply to the processing device by controlling the switch circuit.

FIG. 1 is a block diagram illustrating a low-power touch button sensing system, according to an embodiment. Low-power touch button sensing system 100 includes power supply 116 external to the low-power touch button circuit 101. In another embodiment, another power supply (not shown) may power low-power touch button circuit 101. Low-power touch button circuit 101 may measure for a touch, also referred to as a presence of a touch object proximate to a touch button, such as touch button 114. When low-power touch button circuit 101 senses a qualified touch event (e.g., a measurement value of touch button 114 that exceeds a touch threshold value), the capacitance sensing circuit 110 conditionally controls switch circuit 112 to provide power to another electronic device, such as processing device 118. It should be appreciated that capacitance sensing circuit 110 may perform all the functions and includes similar components as discussed with respect to low-power touch button circuit 101.

Power supply 116 may supply electric power to all or part of one or more electronic devices, such as a low-power touch button circuit 101 and or processing device 118. Power supply 116 may be external to an electronic device (e.g., low-power touch button circuit 101 and or processing device 118) and when electrically connected to the electronic device, supplies power for the entire electronic device, including the multiple circuits of the electronic device. Power supply 116 may comprise a battery or an energy harvesting device or another source of electrical power.

An external switch (not shown), for example, may connect and disconnect power supply 116 from low-power touch button circuit 101. When the power supply 116 connects to the low-power touch button circuit 101 (i.e., the power supply 116 having been previously unconnected to low-power touch button circuit 101), low-power touch button circuit 101 including capacitance sensing circuit 110 receives an application of the power supply 116. For example, the application of the power supply 116 may occur at power-up of low-power touch button circuit 101 when power supply 116 changes from being disconnect from the low-power touch button circuit to being connected to low-power touch button circuit 101. Power supply may be any power source capable of supplying power. In one embodiment, power supply 116 is low-capacity power source such as battery, wireless signal, or the like.

Low-power touch button circuit 101 includes switch circuit 112. Switch circuit 112 may be an electric circuit capable of being controlled to connect and disconnect power supply 116 from an electronic device, such as processing device 118. Switch circuit 112 may be internal or external to low-power touch button circuit 101. Switch circuit 112 may be a discrete or integrated circuit. Switch circuit 112 may be a power switch such as a switch including a power metal-oxide-semiconductor field-effect transistor (MOSFET), a bipolar junction transistor (BJT), silicon-controlled rectifier (SCR), or other switch circuit. Switch circuit 112 may be connected to capacitance sensing circuit 110 via switch control 180. For example, capacitance sensing circuit 110 may control the gate voltage of switch circuit 112 to open or close switch circuit 112 allowing power supply 116 to be connected or disconnected to processing device 118.

Low-power touch button circuit 101 may include capacitance sensing circuit 110. Capacitance sensing circuit 110 may be used to measure touch button 114 to detect a presence of a touch object proximate to touch button 114. In one embodiment, capacitance sensing circuit 110 may be a low-power device that consumes less than 100 nanoamperes (nA) during operation (i.e., average current consumption over a time period such as a second, minute, hour, or day). In one embodiment, capacitance sensing circuit 110 may operate in a normal mode. In normal mode, the capacitance sensing circuit 110 may operate for a percentage of a time period in an idle state. For example, in an idle state, the oscillator of the bias generator, oscillator, time circuit (e.g., BOT circuit 330 of FIG. 3) runs but the analog front end (e.g., AFE 332 of FIG. 3) is turned off. In the idle state, the capacitance sensing circuit 110 may consume, for example, approximately 10 nA for 91% of the time period. At intervals, for example every second, minute, day, etc., capacitance sensing circuit 110 may change from an idle state to an active state. In an active state, the capacitance sensing circuit 110 may turn on AFE 332 to measure for a signal indicative (e.g., current and or voltage) of the presence of a touch object proximate to touch button 114. In the active state, capacitance sensing circuit 110 may consume, for example, approximately 1 microampere ($\mu$A) for 9% of the time period. In the above example, the capacitance sensing circuit 110 consumes approximately an average of 99.1 nA during operation (e.g., 10 nA×91%+1 $\mu$A×9%) during the time period. It should be appreciated that the percentage of the time period that the capacitance sensing circuit 110 is in the active state may be any percentage (e.g., 100%, 50%, 10%, 5%, 1%, 0.1%, etc.). The minimum average power consumption during operation of low-power touch button circuit 101 may be approximately the current consumption during the idle state. Low-power may refer to the average current consumption over a time period of a device, such as capacitance sensing circuit 110 or low-power touch button circuit 101, during operation and at any operating voltage. In one embodiment, capacitance sensing circuit 110 may consume less than 100 nA during operation. It should also be appreciated that capacitance sensing circuit 110 may consume less or more than an average of 100 nA during operation, such as 20 nAm 200 nA, 500 nA, etc.

In normal mode, if no presence of a touch object is detected, capacitance sensing circuit 110 may return to an idle state, and wait for another interval to measure for a presence of a touch object. If a presence of a touch object is detected, capacitance sensing circuit 110 may control switch circuit 112 to connect power supply 116 to processing device 118. It should be noted that low-power touch button circuit 101 may be configured to control switch circuit 112 in response to any number of detected touch combinations or other events (e.g., timer events or delay events). Capacitance sensing circuit 110 will be further described in the following figures, such as FIGS. 2-7. It should be appreciated that one or touch buttons may be present and that a presence of a touch object on one or more of the touch buttons may not cause capacitance sensing circuit 110 to connect and or disconnect power supply 116 and processing device 118. For example, capacitance sensing circuit 110 may keep the power supply 116 disconnected from processing device 118 when a presence of a touch in on the other touch buttons (e.g., touch buttons (not shown) in addition to touch button 114 (e.g., capacitance sensing circuit 110 may not measure for a presence of a touch on the other touch buttons).

Touch button 114 may be electrically connected to low-power touch button circuit 101. Touch button 114 may be part of low-power touch button circuit 101 (e.g., a pad or trace on a board or on chip) or a discrete component (e.g., connected to low power touch button circuit 101 via a connecting terminal). The touch button 114 may be any type of button that senses a touch using an electric signal. Examples of touch button 114 may be a capacitive button, a resistive button, an optical button, or the like. Although one touch button 114 is illustrated, it should be appreciated that one or more touch buttons may be used.

In one embodiment, touch button 114 is a capacitive button. The capacitive button may be a self-capacitance button or a mutual capacitance button. The capacitive button may include one or more conductive electrodes. A presence of a touch object proximate to a capacitive button changes the capacitance associated with the capacitive button. The signal representing the capacitance associated with the button may be measured, and the measured signal indicative of capacitance may be used to determine a presence of a touch object proximate to the capacitive button.

A touch object (not shown) refers to a conductive item capable of conducting electric charge. A passive touch object refers to a conductive item physically unconnected (e.g., lacking an electric wire, electric cable, etc.) to a power supply (e.g., battery, physical capacitor, etc.) and or a conductive item unable to generate and or store an electric signal. In one example, a passive touch object may be a part of a human body, such a human hand and or human finger. In another example, a passive touch object may be a passive stylus.

Processing device 118 may include a microprocessor or central processing unit, a controller, special-purpose processor, digital signal processor (DSP), a state machine, an application specific integrated circuit (ASIC), a field programmable gate array (FPGA), or the like. In one embodiment, processing device 118 may be any electronic device capable of consuming electric power, such as a mobile phone, tablet, camera, or other portable electronic device.

Figure 2:
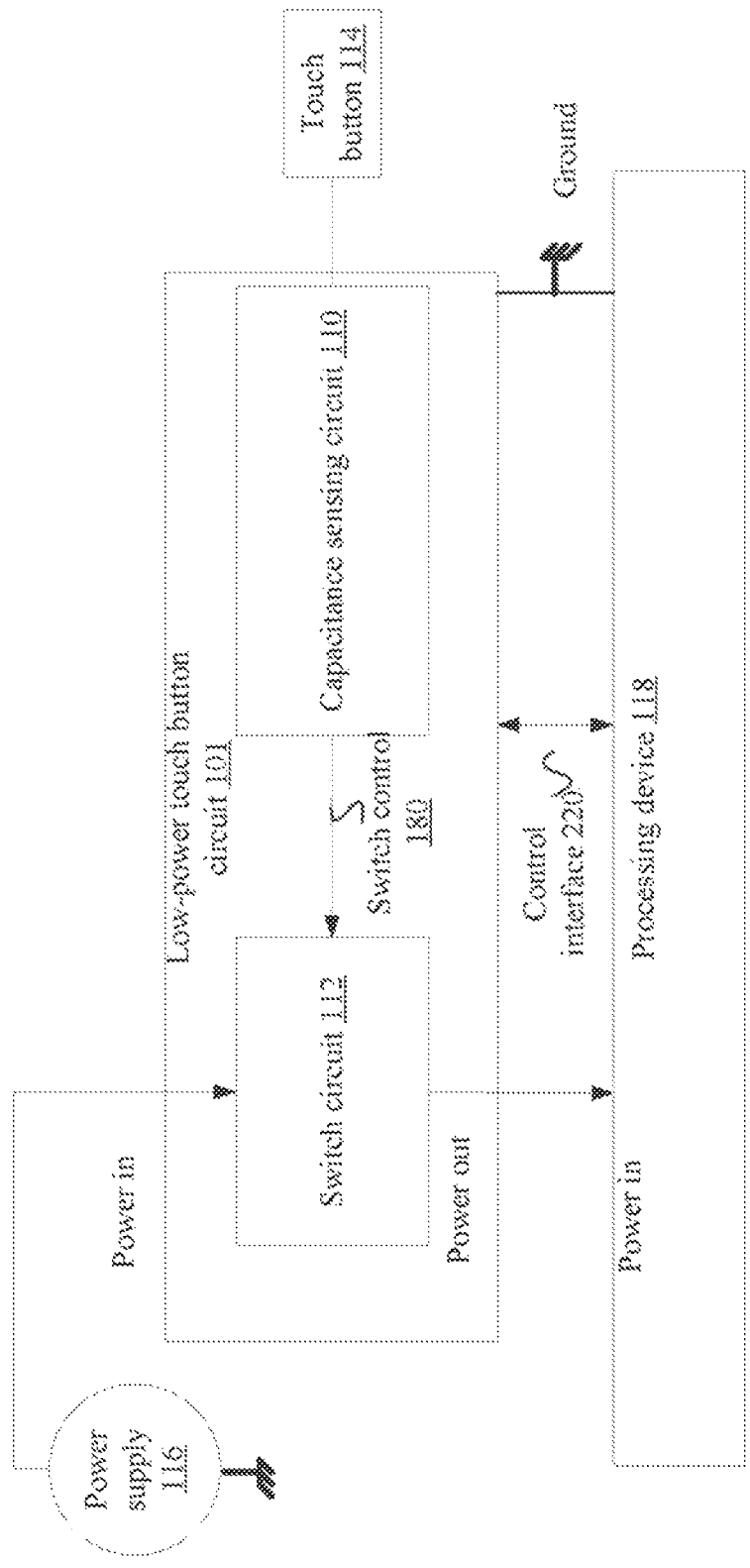
FIG. 2 illustrates a low-power touch button sensing system with a control interface, according to one embodiment.

FIG. 2 illustrates a low-power touch button sensing system with a control interface, according to one embodiment. Low-power touch button system 200 includes the same or similar components and functionality as described above and additionally includes control interface 220. The control interface 220 may be an interface to exchange information (e.g., data) to and from low-power touch button circuit 101. Control interface 220 may be a serial interface (such as SPI or I2C) or a parallel interface. Processing device 118 may use control interface 220 to read information from or write information to low-power touch button circuit 101.

Low-power touch button circuit 101 may include volatile memory and or non-volatile memory. Volatile memory, such as registers, and non-volatile memory may be set to a default configuration on a power-up and or set from control information received via control interface 220.

In one embodiment, as described above, a low-power touch button circuit 101 receives an application of a power supply 116 at power-up. After the application of the power supply 116, the capacitance sensing circuit 110 automatically controls a switch circuit 112 to connect the power supply 116 to a processing device 118. The processing device 118 receives power from the power supply and performs a power-up routine including sending, via a control interface 220 to the capacitance sensing circuit 110, control information to configure the capacitance sensing circuit 110 via a control interface 220.

The control information may include data indicating events for which the low-power touch button circuit 101 is to turn-off and connect or disconnect power supply 116 from processing device 118. For example, the control information may be loaded into registers of the low-power touch button circuit 101. The control information may indicate what type of touch events (e.g., a single touch, a pattern of touches, multiples touches, the time between touches, touch threshold values, etc.) detected by low-power touch button circuit 101 cause the low-power touch button circuit 101 to connect power supply 116 to processing device 118. The control information may indicate what type of timer event (e.g., predetermined and or programmed clock cycles) the low-power touch button circuit 101 is to measure for a presence of a touch object proximate touch button 114 and or connect power supply 116 to processing device 118 independent of a detected touch. The control information may also indicate what type of disconnect event (e.g., signal from processing device 118, number of clock cycles, no touch detected, etc.) the low-power touch button circuit 101 is to disconnect the power supply 116 from processing device 118. The control information may indicate what type of event (e.g., touch event, timer event, etc.) low-power touch button circuit 101 is to send a signal, for example, interrupt signal to processing device 118. For example, processing device may be connected to power supply 116 but operating in a sleep mode. When low-power touch button circuit 101 detects a touch, low-power touch button circuit 101 may send an interrupt signal to processing device 118 to, for example, wake up processing device 118. It should be appreciated that the control information may include any number of events to cause the low-power touch button circuit 101 to perform functions, such as but not limited to, change modes, connect and disconnect power supply 116, send and receive information via control interface 220, and or measure for a presence of a touch object proximate to touch button 114, among other functions.

In another embodiment, processing device 118 may use the control interface 220 to send control information to test the functionality of the low-power touch button circuit 101. In still another embodiment, processing device 118 may use the control interface 220 to send control information that informs the low-power circuit to disconnect power supply 116 from the processing device 118. In still another embodiment processing device 118 may use the control interface 220 to receive information about which of the touch buttons currently have a touch object in proximity.

Figure 3:
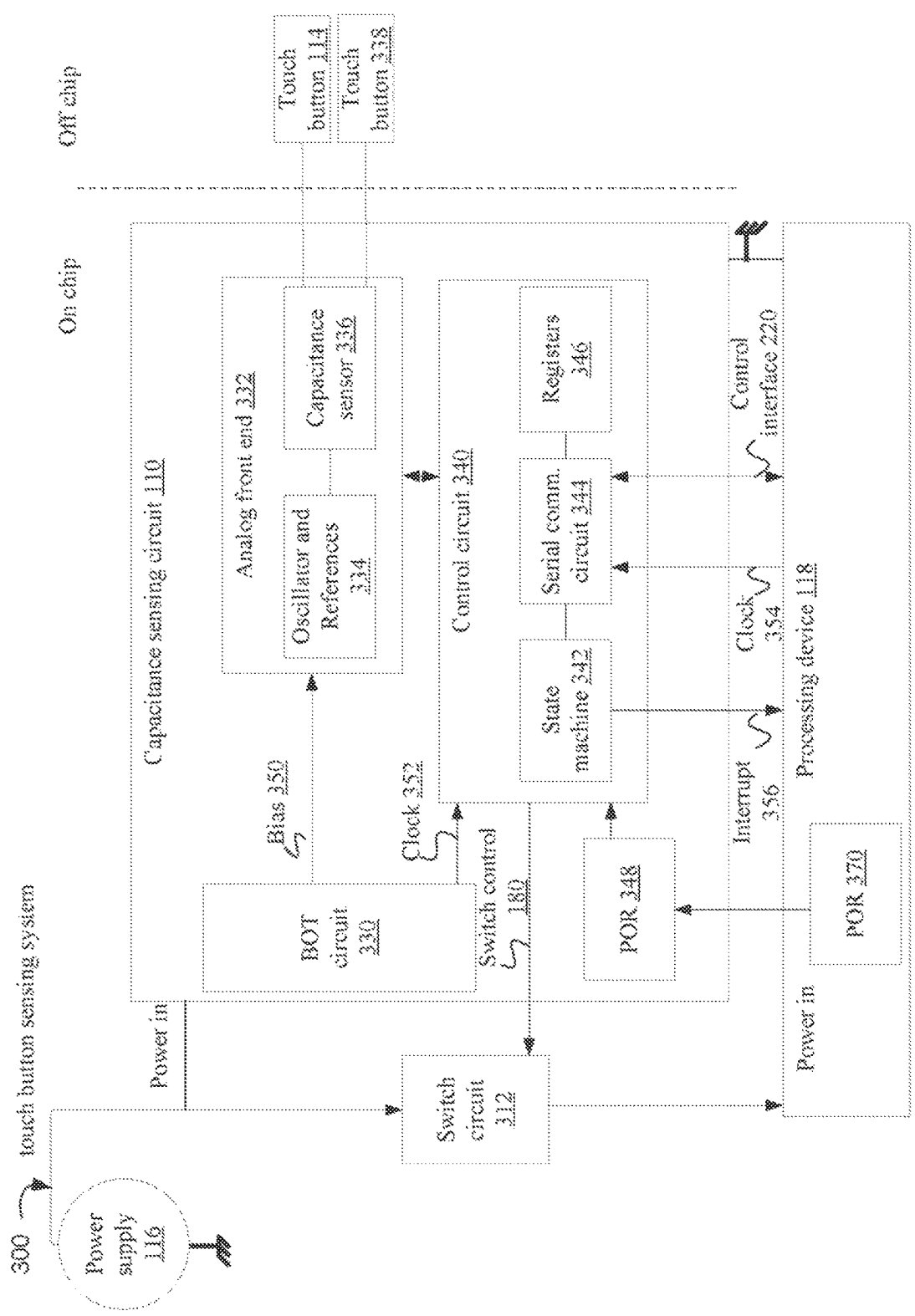
FIG. 3 illustrates a low-power touch button sensing system, according to one embodiment.

FIG. 3 illustrates a low-power touch button sensing system, according to one embodiment. Low-power touch button sensing system 300 functions and includes similar components as described above with respect to FIGS. 1 and 2. Switch circuit 312 is illustrated as a discrete component separate from capacitance sensing circuit 110, but may alternatively be a discrete semiconductor device contained in a single multi-chip package as capacitive sensing circuit 110. Capacitance sensing circuit 110 may perform similar function as low-power touch button circuit 101, as described herein, and vice versa. Capacitance sensing circuit 110 may be a discrete chip, as illustrated, or integrated into another device, such as processing device 118. Touch button 114 and touch button 338 are illustrated as being off chip.

Capacitance sensing circuit 110 includes a bias generator, oscillator, timer (BOT) circuit 330, analog front end (AFE) 332, control circuit 340, and power-on-reset (POR) 348. Processing device 118 includes POR 370 and additional communication lines, such as interrupt 356 and clock 354 connecting to capacitance sensing circuit 110. AFE 332 includes an oscillator and voltage and or current references 334 and capacitance sensor 336 to measure a presence of a touch object proximate to touch button 114 and or touch button 338. Control circuit 340 includes state machine 342, serial communication circuit 344, and registers 346. Capacitance sensing circuit 110 may be connected to processing device 118 via POR 370, interrupt 356, clock 354 and control interface 220, and send and or receive corresponding signals via the connections.

In one embodiment, capacitance sensing circuit 110 may operate in any one of multiple operational modes. For example, capacitance sensing circuit may operate in normal mode, disable mode, or continuous mode. In normal mode, as discussed above with respect to FIG. 1, capacitance sensing circuit 110 may operate in an idle state where the oscillator runs and periodically, switch to an active state where capacitance sensing circuit 110 measures one or more touch buttons to detect a presence of a touch object. When a qualified touch event is detected, e.g., the measured value of the touch exceeds a touch threshold value indicative of a presence of a touch object proximate to a touch button, capacitance sensing circuit 110 may connect power supply 116 to processing device 118 and or generate an interrupt signal. The interrupt signal may be sent to processing device 118 via interrupt 356. Additionally in normal mode, a timer event may be periodically generated (e.g. from delay timer circuit 482 of FIG. 4) independent of a qualified touch event. Responsive to the timer event, capacitance sensing circuit 110 may connect power supply 116 to processing device 118 and or generate an interrupt signal.

In disable mode, the oscillator of BOT circuit 330 may continue to run and the state machine 342 may be disabled. In continuous mode, capacitance sensing circuit 110 may continuously measure for a presence of a touch object proximate to the touch button 114 and or touch button 338. After each reading, capacitance sensing circuit 110 may update registers 346 with the measurement value. When a qualified touch event is detected, capacitance sensing circuit 110 may connect power supply 116 to processing device 118 and or generate an interrupt signal.

BOT circuit 330 includes a timer circuit that sends a clock signal via clock line 352 after some interval. The interval may be hardcoded into BOT circuit 330 or programmed using, for example, the control information received from processing device 118. Control circuit 340 receives the clock signal via clock line 352 and in response, turns on AFE 332. AFE 332 measures for a presence of a touch object proximate to the touch button 114 and or touch button 338. Measurement data may be received by control circuit 340 from AFE 332 and stored in registers 346 and or be sent to processing device 118 via control interface 220. The measurement data may be sent to state machine 342. State machine 342 may use the measurement data to determine if the measurement data qualifies as a state event (also referred to as an event), such as a qualified touch event. If the state machine 342 determines for that the measurement data is a qualified touch event, state machine may execute a corresponding action such as send a control signal via switch control 180 to open or close switch circuit 112 and or send an interrupt signal via interrupt 356. It should be appreciated that state machine 342 may be programmed with any number of qualifying events (e.g., touch event, timer event, multi-touch event, non-touch event, etc.), and is not limited to the events discussed herein.

BOT circuit 330 may provide a bias current and voltage to the AFE 332 and or control circuit 340. Additionally, BOT circuit 330 may include an oscillator, such as a 1 kilo Hertz (kHz) oscillator or other frequency oscillator. BOT circuit 330 may also include a timer circuit, programmable or fixed, to count clock pulses of the oscillator and send a clock signal via clock line 352 after some number of clock pulses (e.g., after a predetermined time period). BOT circuit 330 may operate when capacitance sensing circuit 110 in an idle state (e.g., not measuring for a presence of a touch object) and draw small amounts of current, for example an average of 10 nA over a time period.

Figure 4:
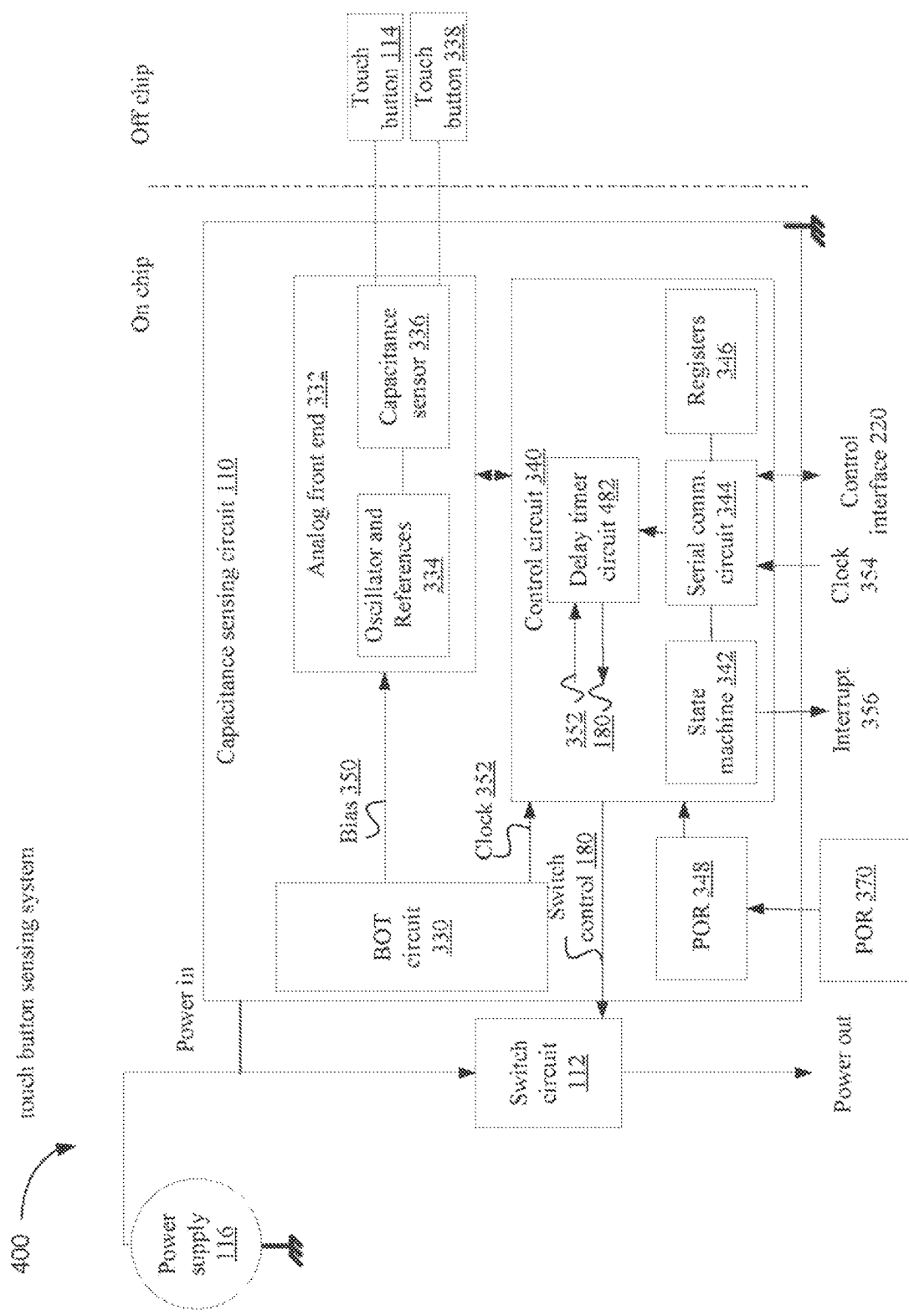
FIG. 4 illustrates a low-power touch button sensing system with a delay timer circuit, according to one embodiment.

FIG. 4 illustrates a low-power touch button sensing system with a delay timer circuit, according to one embodiment. Low-power touch button system 400 may include the functionality and components as discussed above with respect to FIGS. 1-3. Capacitance sensing circuit 110 illustrates one embodiment of a circuit capable of periodically connecting power supply 116 to processing device 118, independent of a detected presence of a touch object. It should be appreciated that low-power touch button system 400 may also include a processing device, such as processing device 118 (not shown in FIG. 4).

In one embodiment, control circuit 340 may include a delay timer circuit 482, also referred to as a watch dog timer, to periodically generate a control signal. The delay timer circuit 482 may be clocked from an oscillator or may be a self-timed circuit such as a monostable circuit. The control signal may be sent to switch circuit 112 via switch control 180. Responsive to the control signal, switch circuit 112 may open and connect power supply 116 to processing device 118. The control signal generated by delay timer circuit 482 may be independent of a detected presence of a touch object. The period may be hard-coded or programmed by, for example, control information received from processing device 118. The period may be any length such as seconds, minutes, day, years, etc.

Figure 5:
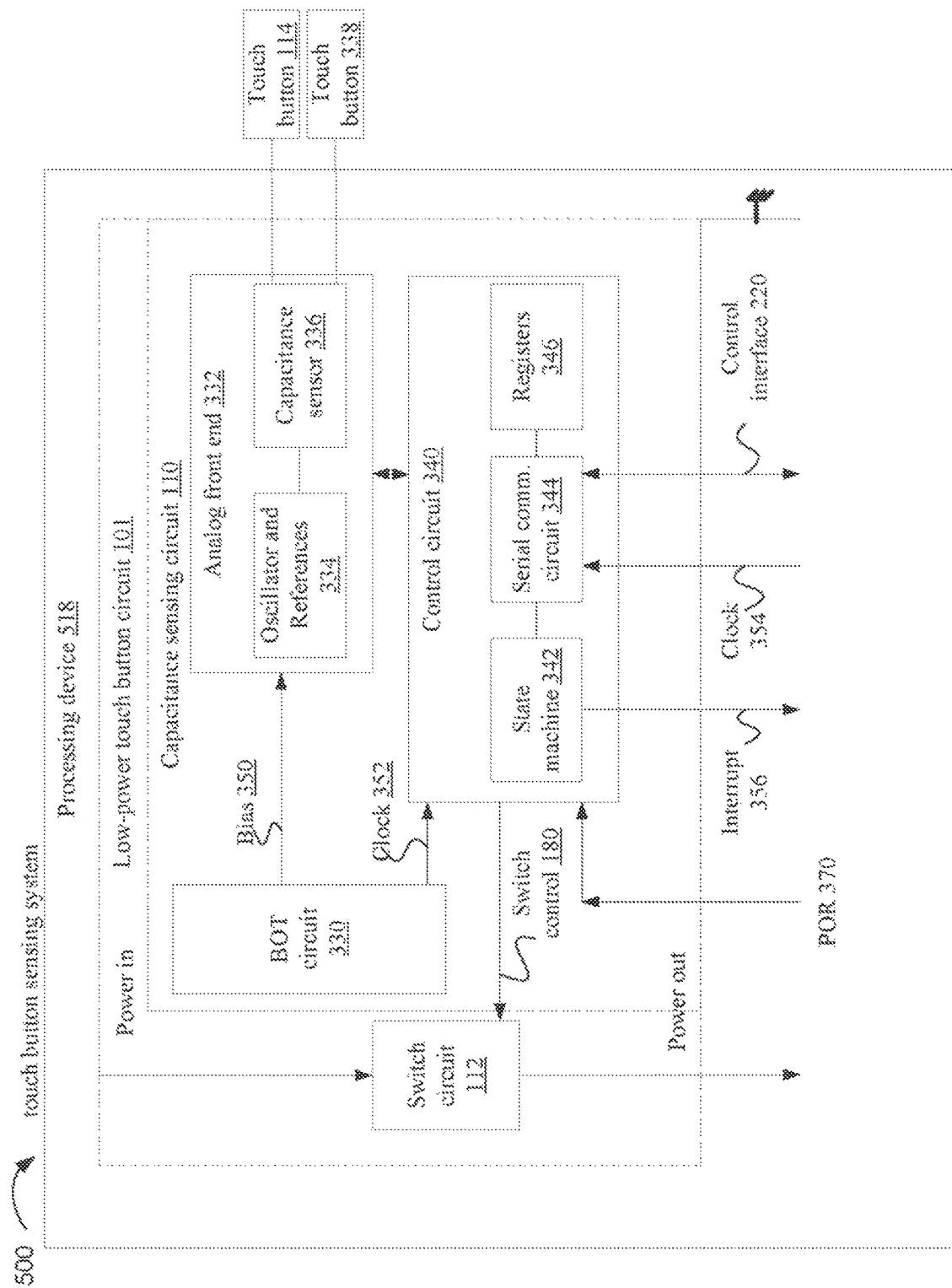
FIG. 5 illustrates a low-power touch button sensing system integrated into a processing device, according to one embodiment.

FIG. 5 illustrates a low-power touch button sensing system integrated into a processing device, according to one embodiment. Low-power touch button system 500 illustrates low-power touch button circuit 101 integrated with processing device 518 on a single chip. Low-power touch button system 500 may include the functionality and components as discussed above with respect to FIGS. 1-4. The power supply (not shown) may be provided by the processing device 518. The processing device 518 may enable low-power touch button circuit 101 at any time, by for example, supplying power to low-power touch button circuit 101. Processing device 518 may use low-power touch button circuit 101 to measure for a presence of a touch object proximate to touch button 114 and or touch button 338 by for example, setting low-power touch button circuit 101 on continuous mode, as discussed above. In one embodiment, processing device 518 may provide POR 370 as an input to low-power touch button circuit 101 and or remove POR 348 (in FIG. 4) from low-power touch button circuit 101.

In one embodiment, processing device 518 may use POR 370 to reset low-power touch button circuit 101 and configure low-power touch button circuit 101 using control information, as described above.

In another embodiment, processing device 518 may set the mode of low-power touch button circuit 101 to disable, normal, or continuous by sending a signal via control interface 220.

In another embodiment, after setting the mode, processing device 518 may go into a low-power mode or sleep mode. When low-power touch button circuit 101 senses a qualified touch event, low-power touch button circuit 101 may send an interrupt signal to wake up processing device 518 or to cause processing device 118 to change modes. In another embodiment, processing device 518 may be awake (e.g., not in low-power mode) when low-power touch button circuit 101 is in disable, normal, or continuous mode.

Figure 6:
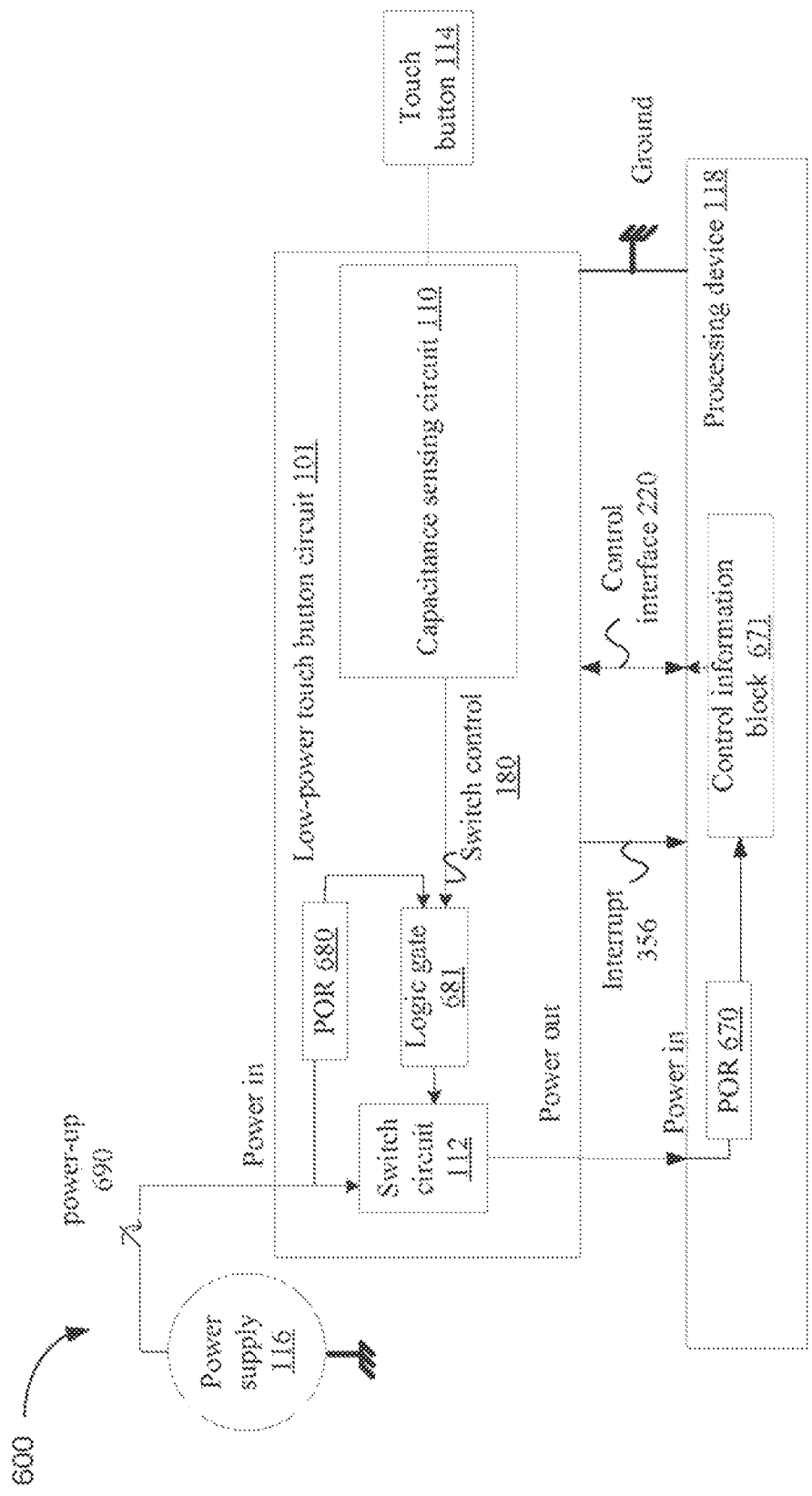
FIG. 6 illustrates a low-power touch button sensing system configured to receive an application of a power supply, according to one embodiment.

FIG. 6 illustrates a low-power touch button sensing system configured to receive an application of a power supply, according to one embodiment. Low-power touch button system 600 may include the functionality and components as discussed above with respect to FIGS. 1-5. Power-up may refer to the application of a power supply 116 to low-power touch button circuit 101 where the power supply 116 previously is disconnected from low-power touch button circuit 101. Power-up 690 illustrates power supply 116 being applied to low-power touch button circuit 101 from a previously unconnected state.

In one embodiment, power supply 116 is applied to low-power touch button circuit 101. In response to the application of power supply 116, POR 680 may send a signal to logic gate 681. Logic gate 681 may be any type of logic gate, such as a logical OR gate. In response to the signal from POR 680, logic gate 681 sends a control signal to switch circuit 112 to connect power supply 116 to processing device 118. In response, power supply 116 enables POR 670 of processing device 118. POR 670 sends a signal to control information block 671. In one embodiment, control information block 671 sends control information, via control interface 220, to configure low-power touch button circuit 101. In another embodiment, control information block 671 sends control information to test low-power touch button circuit 101. In another embodiment, control information block 671 sends a signal indicating low-power touch button circuit is to disconnect power supply 116 from processing device 118. Capacitance sensing circuit 110 may disconnect the power supply in response to receiving the control information, in response to detecting a qualifying touch event, in response to receiving a signal from processing device 118, or in response to any other detected event.

Figure 7:
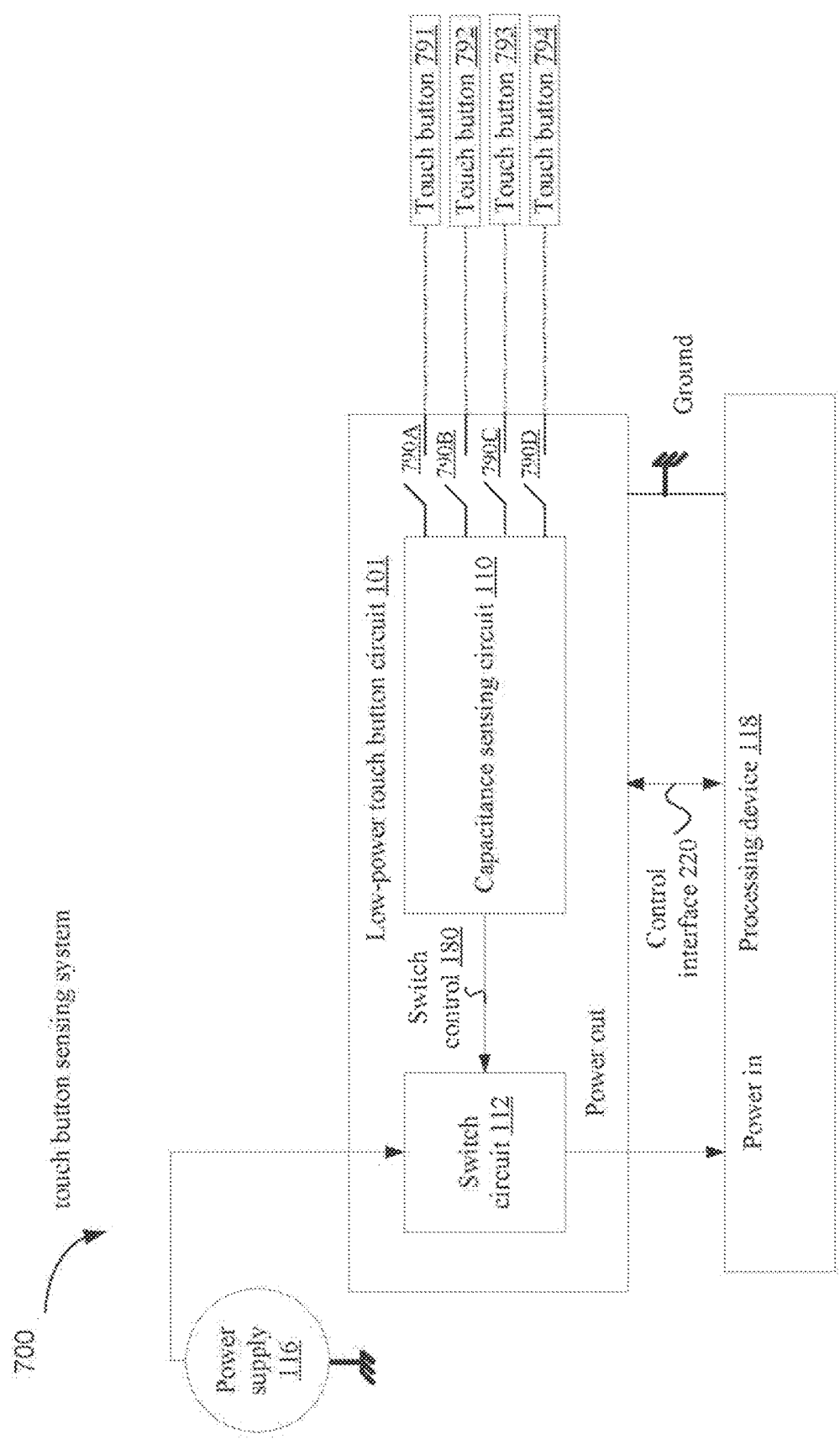
FIG. 7 illustrates a low-power touch button sensing system with touch button switches, according to one embodiment.

FIG. 7 illustrates a low-power touch button sensing system with touch button switches, according to one embodiment. In one embodiment, touch button switches 790 may be used to couple some or all of the touch buttons 791-794 into a composite button. In one embodiment, some but not all of the touch buttons 791-794 may be capable of being coupled together, via touch button switches 790, to form a composite button. Low-power touch button system 700 may include the functionality and components as discussed above with respect to FIGS. 1-6. Low-power touch button circuit 101 includes touch button switches 790 including touch button switch 790A, touch button switch 790B, touch button switch 790C, and touch button switch 790D connected to touch button 791, touch button 792, touch button 793, and touch button 794, respectively. It should be appreciated that any number of touch button switches and any number of touch buttons may be used. Touch button switches 790 may be part of low-power touch button circuit 101, capacitance sensing circuit 110, or external to the aforementioned. Touch button switches 790 may be controlled by low-power touch button circuit 101, processing device 118, or another device. In one embodiment, the function of the touch button switches 790 is implemented within the capacitance sensing circuit 110 rather than using separate switches.

In one embodiment, touch button switches 790 may be used to couple multiple touch buttons into a composite button. Capacitance sensing circuit 110 may measure a signal indicative a capacitance of the composite button to detect a presence of a touch object. For example, touch button switches 790 may all be closed to connect touch button 791, touch button 792, touch button 793, and touch button 794 to capacitance sensing circuit 110. Capacitance sensing circuit 110 may measure a signal indicative of a single capacitance for the composite button. In one embodiment, the composite button may be sensed using self-capacitance sensing, and the touch buttons sensed individually using mutual capacitance sensing. In another embodiment, the composite button may be sensed using mutual-capacitance sensing, and the touch buttons 791-794 sensed individually using self-capacitance sensing. In yet another embodiment, the composite button and individual touch buttons 791-794 may be sensed using the same type of capacitance sensing.

In one embodiment, touch button 791, touch button 792, touch button 793, and touch button 794 may be coupled together and measured to detect a presence of a touch object proximate to the composite button. When a presence of a touch object is detected on the composite button, capacitance sensing circuit 110 may further measure a signal indicative of a capacitance for each of the touch buttons separately by control of touch button switches 790. For example, capacitance sensing circuit 110 may periodically measure for a presence of a touch object on the composite button (which may be formed from all or only some of the individual touch buttons 791-794). Once a presence of a touch object is detected on the composite button, capacitance sensing circuit 110 may wait to detect a password or sequence of button touches that satisfy as a qualifying event. Once the correct sequence of touches is detected, low-power touch button circuit 101 may connect power supply 116 to processing device 118. If the correct sequence of touches is not detected, low-power touch button circuit 101 may continue to disconnect power supply 116 from processing device 118. It should be appreciated that other types of touch buttons, other than capacitive touch buttons, may be coupled and or used together and measured to detect a presence of a touch object.

Figure 8:
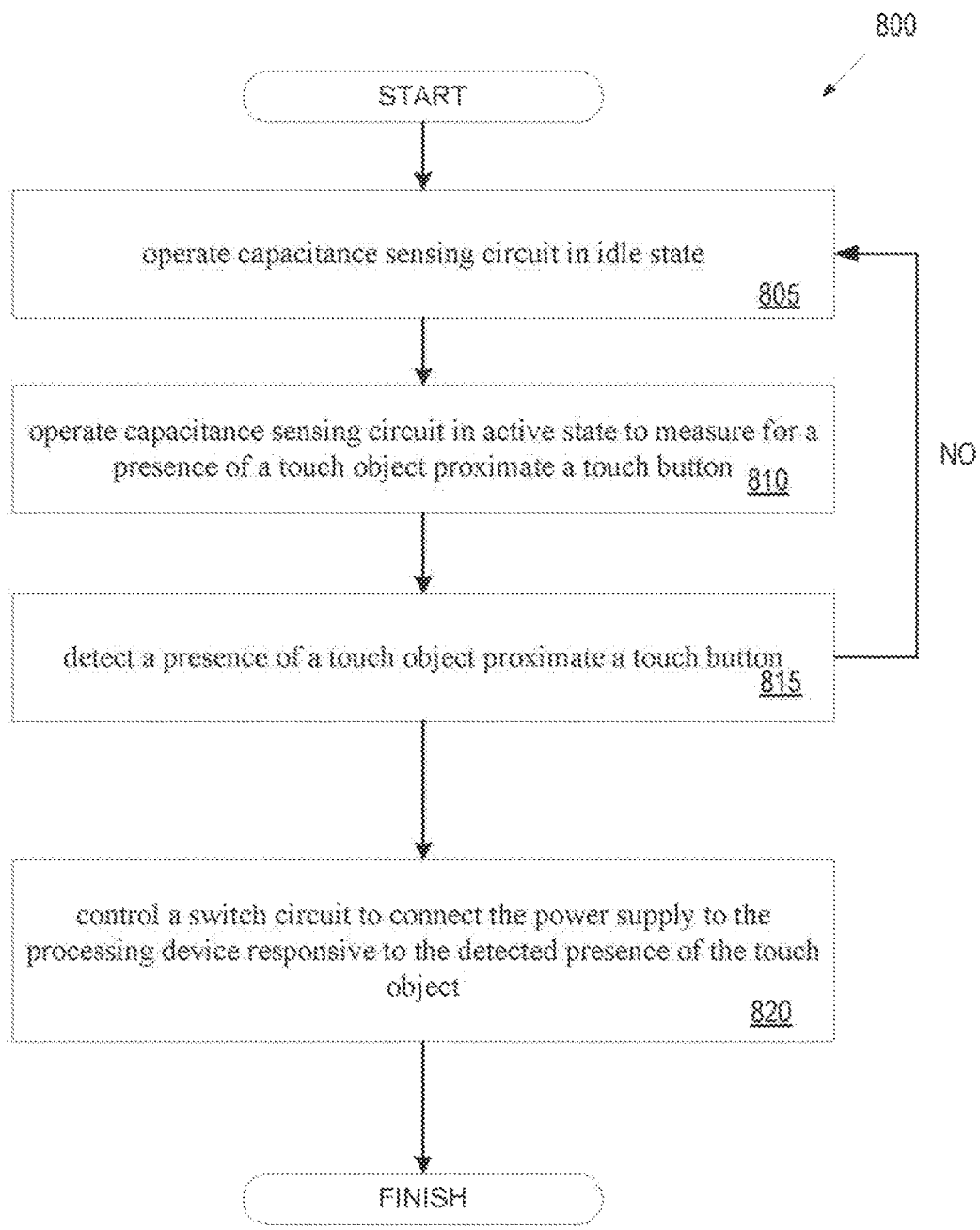
FIG. 8 is a flow diagram illustrating the operation of a low-power touch button sensing system, according to one embodiment.

FIG. 8 is a flow diagram illustrating the operation of a low-power touch button sensing system, according to one embodiment. Method 800 may be performed by processing logic that comprises hardware (e.g., circuitry, dedicated logic, programmable logic, microcode), software (e.g., instructions run on a processing device to perform hardware simulation), or a combination thereof. In one embodiment, low-power touch button circuit 101 and or capacitance sensing circuit 110 may perform some or all the operations described herein.

Method 800 begins at block 805 where processing logic performing the method operates capacitance sensing circuit 110 in an idle state. In one example, in the idle state the oscillator of BOT 330 is running and AFE 332 is turned off. At block 810, processing logic changes capacitance sensing circuit 110 from an idle state to an active state to measure for a presence of a touch object proximate to a touch button, such as touch button 114. The change from idle state to active state may occur at intervals. In one example, BOT circuit 330 may send a clock signal via clock 352 at intervals to control circuit 340 to turn on AFE 332 to measure for a presence of a touch object. The intervals may be determined by a timer of BOT circuit 330 that counts pulses of the oscillator of BOT circuit 330 and sends the clock signal via clock 352 after a predetermined number of pulses (e.g., 1000 pulses or 1 second, 1 minute, etc.). At block 815, processing logic detects a presence of a touch object proximate to a touch button, such as touch button 114. If no presence of a touch object is detected, processing logic returns to block 805 and returns capacitance sensing circuit 110 to an idle state. If a presence of a touch object is detected, processing logic proceeds to block 810, where processing logic in response to detecting a presence of a touch object controls a switch circuit 112 to connect power supply 116 to processing device 118.

Figure 9A:
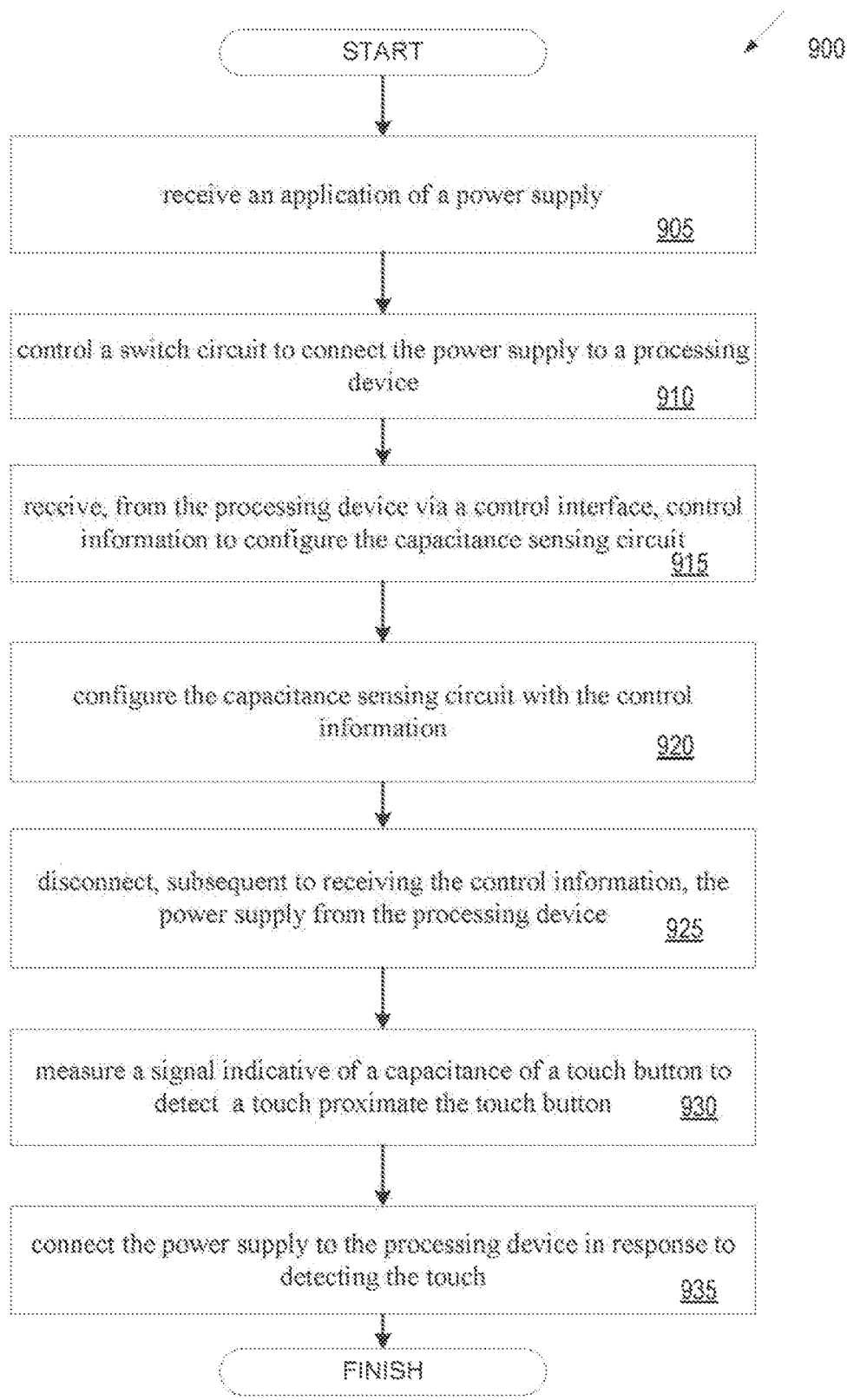
FIG. 9A is a flow diagram illustrating the operation of a low-power touch button sensing system, according to one embodiment.

FIG. 9A is a flow diagram illustrating the operation of a low-power touch button sensing system, according to one embodiment. Method 900 may be performed by processing logic that comprises hardware (e.g., circuitry, dedicated logic, programmable logic, microcode), software (e.g., instructions run on a processing device to perform hardware simulation), or a combination thereof. In one embodiment, low-power touch button circuit 101 and or capacitance sensing circuit 110 may perform some or all the operations described herein.

Method 900 begins at block 905 where processing logic performing the method receives an application of power supply 116. The application of power supply 116 may be at power-up. At block 910, processing logic controls switch circuit 112 to connect power supply 116 to processing device 118. At block 915, processing logic receives, from processing device 118 via control interface 220, control information to configure capacitance sensing circuit 110. At block 920, processing logic configures capacitance sensing circuit 110 with the control information. The control information indicates events capacitance sensing circuit 110 is to connect or disconnect power supply 116 and processing device 118.

At block 925, processing device disconnects, subsequent to receiving the control information, power supply 116 from processing device 118. It should be appreciated that method 900 may incorporate some or all of the operations of method 800. For example, after block 925, processing logic may operate the capacitance sensing circuit 110 in an idle state. After an interval, processing logic may operate capacitance sensing circuit 110 in an active state and move to block 930. At block 930, processing logic may measure a signal indicative of a capacitance of a touch button 114 to detect a presence of a touch object. In one embodiment, a presence of a touch object may be measured on one or more touch buttons individually. In another embodiment, multiple touch buttons may be coupled together to form a composite button. Processing logic may measure a signal indicative of the capacitance of the composite button to detect a presence of a touch object proximate to the composite button. It should be appreciated that if no presence of a touch object is detected, processing logic may return capacitance sensing circuit 110 to an idle state. If a presence of a touch object is detected, processing logic may continue to block 930. At block 930, processing logic connects power supply 116 to processing device 118 in response to detecting a presence of a touch object. In another embodiment, processing logic may control switch circuit 112 to connect power supply 116 to processing device 118 in response to a timer event and independent of a detected presence of a touch object.

Figure 9B:
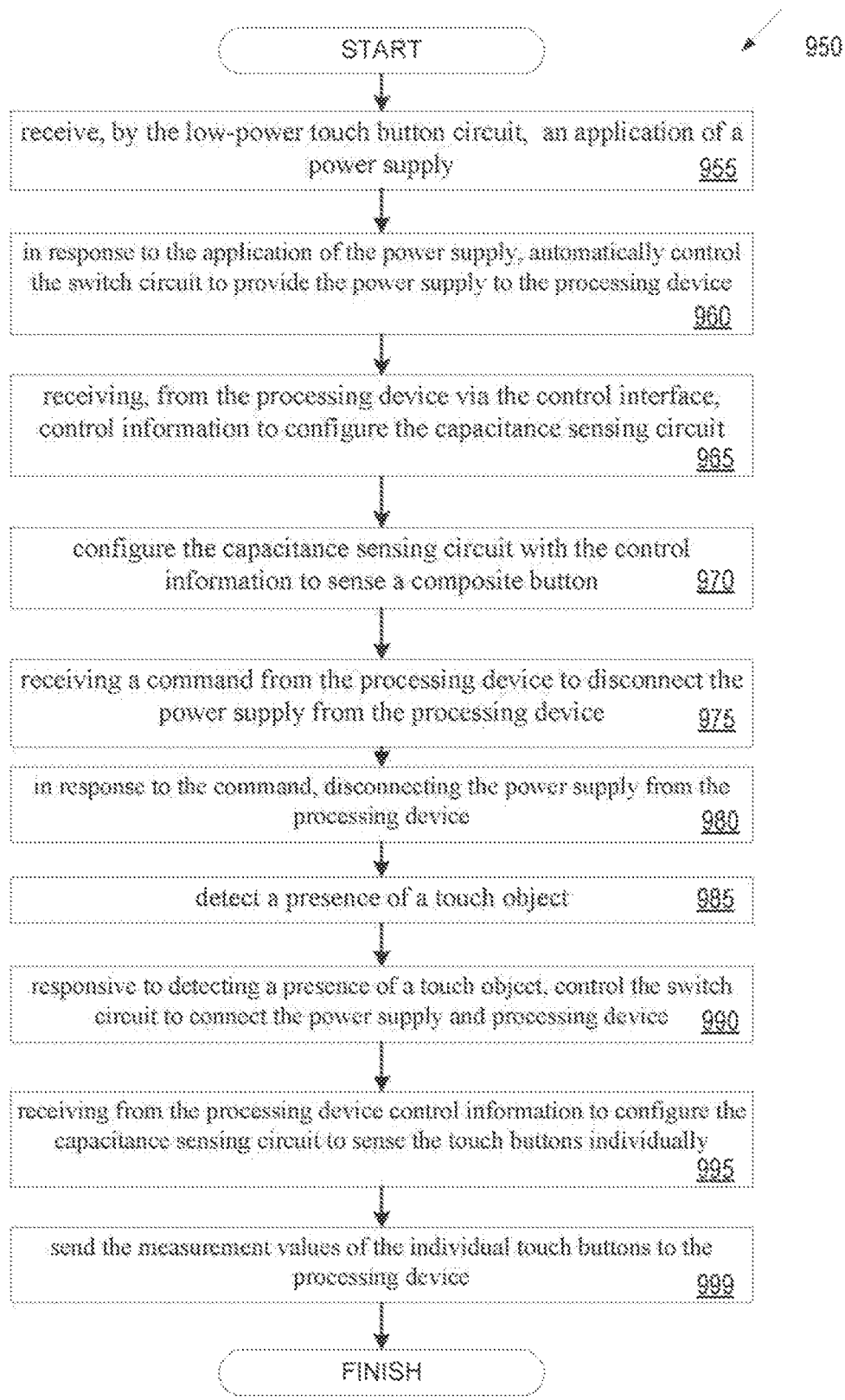
FIG. 9B is a flow diagram illustrating the operation of a low-power touch button sensing system, according to another embodiment.

FIG. 9B is a flow diagram illustrating the operation of a low-power touch button sensing system, according to another embodiment. Method 950 may be performed by processing logic that comprises hardware (e.g., circuitry, dedicated logic, programmable logic, microcode), software (e.g., instructions run on a processing device to perform hardware simulation), or a combination thereof. In one embodiment, low-power touch button circuit 101 and or capacitance sensing circuit 110 may perform some or all the operations described herein.

Method 950 begins at block 955 where processing logic performing the method receives an application of power supply 116. The application of power supply 116 may be at power-up. At block 960, processing logic, in response to the application of power supply 116, automatically controls switch circuit 112 to connect power supply 116 to processing device 118. At block 965, processing logic receives, from processing device 118 via a control interface 220, control information to configure capacitance sensing circuit 110 to sense multiple touch buttons as a composite button. At block 970, processing logic configures capacitance sensing circuit 110 to sense a composite button (e.g., detect a presence of a touch object proximate the composite button). At block 975, processing logic receives a command, via control interface 220, to disconnect power supply 116 from processing device 118 (e.g., by controlling switch circuit 112). At block 980, processing logic, in response to the command, controls switch circuit 112 to disconnect power supply 116 from processing device 118.

At block 985, processing logic detects a presence of a touch object proximate to the composite button. As described above, the capacitance sensing circuit 110 may be operating in a normal mode or continuous mode to detect a presence of a touch object. At block 990, processing logic, responsive to detecting a presence of a touch object proximate the composite button, controls switch circuit 112 to connect power supply 116 to processing device 118. At block 995, processing logic sends control information to capacitance sensing circuit 110 via control interface 220 to configure capacitance sensing circuit 110 to sense the touch buttons individually (e.g., detect a presence of a touch object proximate each touch button individually). Capacitance sensing circuit 110 may operate in normal mode or continuous mode to sense the touch buttons individually. At block 999, processing logic may send the measurement values of each individual touch button to processing device 118. Processing logic may send raw measurement values or state information of the individual buttons, or other information indicative of the measurement of the touch buttons. State information for each touch button may indicate a touch event or non-touch event on the respective touch button as determined by, for example, state machine 342 of capacitance sensing circuit 110.

Figure 10:
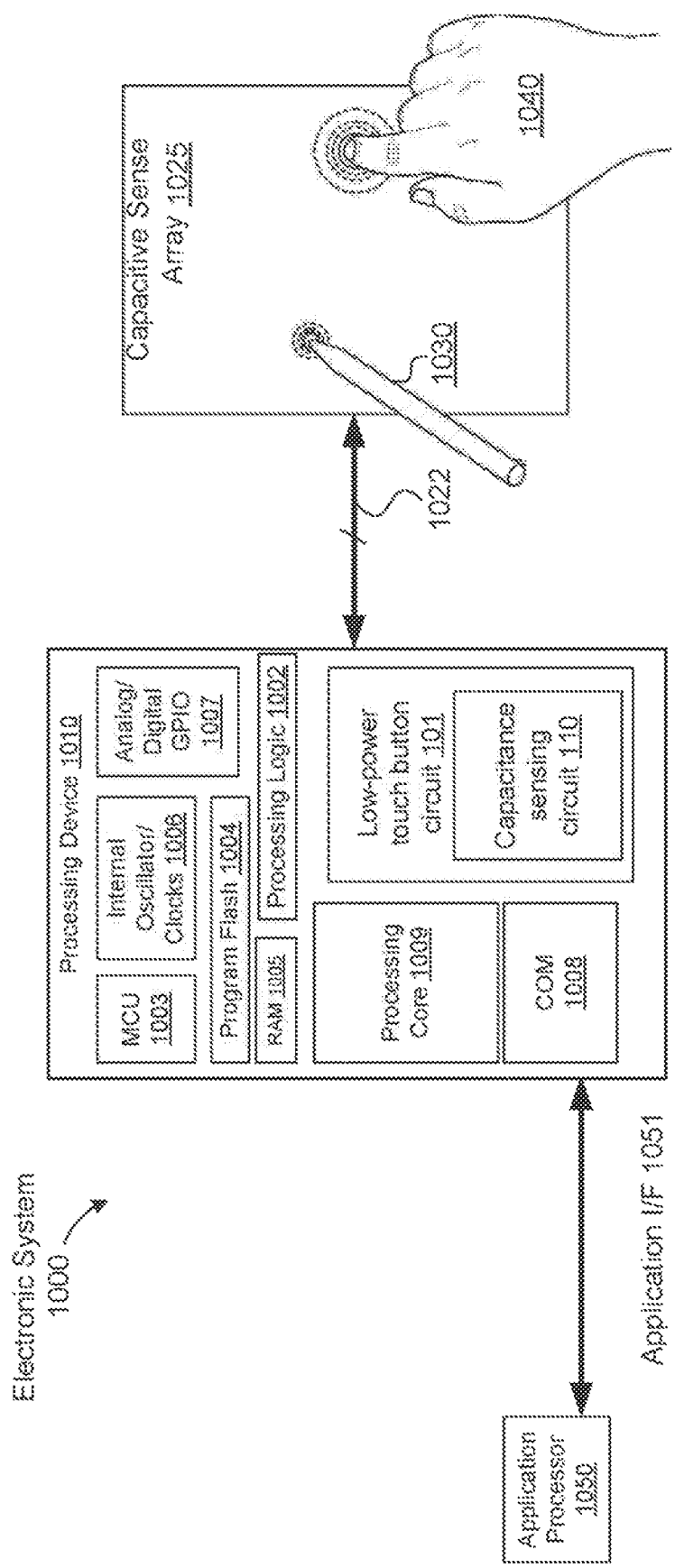
FIG. 10 is a block diagram illustrating an electronic system including a processing device and low-power touch button circuit, according to another embodiment.

FIG. 10 is a block diagram illustrating an electronic system including a processing device and low-power touch button circuit, according to another embodiment. Processing device 1010 may perform the same or similar functions as described with respect to processing device 118 of the above Figures, and vice versa. Capacitive sense array 1025 may include on or more touch buttons, as described above. In another embodiment, low-power touch button circuit 101 may be external to processing device 1010. The processing device 1010 and or low-power touch button circuit 101 is configured to detect one or more presences of a touch object detected proximate to a touch-sensing device, such as capacitive sense array 1025. The processing device 1010 and or low-power touch button circuit 101 may detect conductive objects, such as passive touch object 1040 (e.g., fingers and or passive stylus 1030, or any combination thereof). The low-power touch button circuit 101 may measure touch data created by a presence of a touch object using the capacitive sense array 1025. The presence of a touch object may be detected by a single or multiple sensing cells, each cell representing an isolated sense element or an intersection of sense elements (e.g., electrodes) of the capacitive sense array 1025. In one embodiment, when the low-power touch button circuit 101 measures a signal indicative of mutual capacitance of the touch-sensing device (e.g., using capacitive sense array 1025), the low-power touch button circuit 101 acquires a 2D capacitive image of the touch-sensing object and processes the data for peaks and positional information. In another embodiment, the processing device 1010 is a microcontroller that obtains a capacitance touch signal data set from application processor 1050, and finger detection firmware executing on the microcontroller identifies data set areas that indicate touches, detects and processes peaks, calculates the coordinates, or any combination therefore. The microcontroller may report the precise coordinates to an application processor 1050, as well as other information.

Electronic system 1000 includes processing device 1010, capacitive sense array 1025, passive stylus 1030, and application processor 1050. The capacitive sense array 1025 may include capacitive sense elements that are electrodes of conductive material, such as copper. The conductive material may painted or otherwise attached onto a substrate and or electrodes. The sense elements may also be part of an indium-tin-oxide (ITO) panel. The capacitive sense elements may be used to allow the low-power touch button circuit 101 to measure self-capacitance, mutual capacitance, passive touch detection, other types of touch detection, or any combination thereof. In the depicted embodiment, the electronic system 1000 includes the capacitive sense array 1025 coupled to the processing device 1010 via bus 1022. The capacitive sense array 1025 may include a multi-dimension capacitive sense array. The multi-dimension sense array includes multiple sense elements, organized as rows and columns. In another embodiment, the capacitive sense array 1025 is non-transparent capacitive sense array (e.g., PC touchpad). The capacitive sense array 1025 may be disposed to have a flat surface profile. Alternatively, the capacitive sense array 1025 may have non-flat surface profiles. Alternatively, other configurations of capacitive sense arrays may be used. For example, instead of vertical columns and horizontal rows, the capacitive sense array 1025 may have a hexagon arrangement, or the like, as would be appreciated by one of ordinary skill in the art having the benefit of this disclosure. In one embodiment, the capacitive sense array 1025 may be included in an ITO panel or a touch screen panel.

The operations and configurations of the processing device 1010 and or low-power touch button circuit 101 and the capacitive sense array 1025 for detecting and tracking the passive touch object 1040 are described herein. In short, the processing device 1010 and or low-power touch button circuit 101 is configurable to detect a presence of the passive touch object 1040 on the capacitive sense array 1025.

In the depicted embodiment, the processing device 1010 includes analog and or digital general purpose input/output ("GPIO") ports 1007. GPIO ports 1007 may be programmable. GPIO ports 1007 may be coupled to a Programmable Interconnect and Logic ("PM"), which acts as an interconnect between GPIO ports 1007 and a digital block array (not shown) of the processing device 1010. The digital block array may be configurable to implement a variety of digital logic circuits (e.g., DACs, digital filters, or digital control systems) using, in one embodiment, configurable user modules ("UMs"). The digital block array may be coupled to a system bus. Processing device 1010 may also include a memory device, such as random access memory ("RAM") 1005 and program flash 1004. RAM 1005 may be static RAM ("SRAM"), and program flash 1004 may be a non-volatile storage, which may be used to store firmware (e.g., control algorithms executable by processing core 1009 to implement operations described herein). Processing device 1010 may also include a memory controller unit ("MCU") 1003 coupled to memory and the processing core 1009. The processing core 1009 is a processing element configured to execute instructions or perform operations. The processing device 1010 may include other processing elements as would be appreciated by one of ordinary skill in the art having the benefit of this disclosure. It should also be noted that the memory may be internal to the processing device or external to it. In the case of the memory being internal, the memory may be coupled to a processing element, such as the processing core 1009. In the case of the memory being external to the processing device, the processing device is coupled to the other device in which the memory resides as would be appreciated by one of ordinary skill in the art having the benefit of this disclosure.

In one embodiment, the processing device 1010 and or low-power touch button circuit 101 further includes processing logic 1002. Some or all of the operations of the processing logic 1002 may be implemented in firmware, hardware, or software or some combination thereof. The processing logic 1002 may receive signals from the low-power touch button circuit 101, and determine the state of the capacitive sense array 1025, such as whether an passive touch object 1040 (e.g., a finger) is detected on or in proximity to the capacitive sense array 1025 (e.g., determining the presence of the object), resolve where the passive touch object 1040 is on the sense array (e.g., determining the location of the passive touch object 1040), tracking the motion of the passive touch object 1040, or other information related to an passive touch object 1040 detected at the touch sensor. In another embodiment, processing logic 1002 may include low-power touch button circuit 101. In another embodiment, processing logic 1002 may perform some or all the functions of low-power touch button circuit 101 and or processing device 1010.

The processing device 1010 may also include an analog block array (not shown) (e.g., field-programmable analog array). The analog block array is also coupled to the system bus. Analog block array may also be configurable to implement a variety of analog circuits (e.g., ADCs or analog filters) using, in one embodiment, configurable UMs. The analog block array may also be coupled to the GPIO 1007.

As illustrated, low-power touch button circuit 101 may be integrated into processing device 1010. Low-power touch button circuit 101 may include analog I/O for coupling to an external component, such as touch-sensor pad (not shown), capacitive sense array 1025, touch-sensor slider (not shown), touch-sensor buttons (not shown), and or other devices. The low-power touch button circuit 101 may be configurable to measure a signal indicative of capacitance using mutual-capacitance touch detection techniques, self-capacitance touch detection techniques, passive touch detection techniques, charge-coupling techniques, charge balancing techniques, or the like. In one embodiment, low-power touch button circuit 101 operates using a charge accumulation circuit, a capacitance modulation circuit, or other capacitance sensing methods known by those skilled in the art. In an embodiment, the low-power touch button circuit 101 is of the Cypress TMA-3xx, TMA-4xx, or TMA-xx families of touch screen controllers. Alternatively, other low-power touch button circuits may be used. The mutual capacitive sense arrays, or touch screens, as described herein, may include a transparent, conductive sense array disposed on, in, or under either a visual display itself (e.g. LCD monitor), or a transparent substrate in front of the display. In an embodiment, the transmission (TX) and receiving (RX) electrodes are configured in rows and columns, respectively. It should be noted that the rows and columns of electrodes may be configured as TX or RX electrodes by the low-power touch button circuit 101 in any chosen combination. In one embodiment, the TX and RX electrodes of the sense array 1025 are configurable to operate as a TX and RX electrodes of a mutual capacitive sense array in a first mode to detect passive touch objects, and to operate as electrodes of a coupled-charge receiver in a second mode to detect a stylus on the same electrodes of the sense array. An intersection between two sense elements may be understood as a location at which one sense electrode crosses over or overlaps another, while maintaining galvanic isolation from each other. The capacitance associated with the intersection between a TX electrode and an RX electrode may be sensed by selecting every available combination of TX electrode and RX electrode. When a passive touch object 1040 approaches the capacitive sense array 1025, the object causes a decrease in mutual capacitance between some of the TX/RX electrodes. In another embodiment, the presence of a finger increases the capacitance of the electrodes to the environment (Earth) ground, typically referred to as self-capacitance change. Utilizing the change in mutual capacitance, the location of the finger on the capacitive sense array 1025 may be determined by identifying the RX electrode having a decreased coupling capacitance between the RX electrode and the TX electrode to which the TX signal was applied at the time the decreased capacitance was measured on the RX electrode. Therefore, by sequentially measuring signals to determine measurements representing the capacitances associated with the intersection of electrodes, the locations of one or more touch objects may be determined. It should be noted that the process may calibrate the sense elements (intersections of RX and TX electrodes) by determining baselines for the sense elements. It should also be noted that interpolation may be used to detect finger position at better resolutions than the row/column pitch as would be appreciated by one of ordinary skill in the art having the benefit of this disclosure. In addition, various types of coordinate interpolation algorithms may be used to detect the center of the touch as would be appreciated by one of ordinary skill in the art having the benefit of this disclosure.

Processing device 1010 and or low-power touch button circuit 101 may include internal oscillator/clocks 1006 and communication block ("COM") 1008. In another embodiment, the processing device 1010 includes a spread-spectrum clock (not shown). The oscillator/clocks block 1006 provides clock signals to one or more of the components of processing device 1010. Communication block 1008 may be used to communicate with an external component, such as an application processor 1050, via application interface ("I/F") line 1051.

Processing device 1010 and or low-power touch button circuit 101 may reside on a common carrier substrate such as, for example, an integrated circuit ("IC") die substrate, a multi-chip module substrate, or the like. Alternatively, the components of processing device 1010 may be one or more separate integrated circuits and or discrete components. In one exemplary embodiment, processing device 1010 is the Programmable System on a Chip (PSoC®) processing device, developed by Cypress Semiconductor Corporation, San Jose, Calif. Alternatively, processing device 1010 may be one or more other processing devices known by those of ordinary skill in the art, such as a microprocessor or central processing unit, a controller, special-purpose processor, digital signal processor ("DSP"), an application specific integrated circuit ("ASIC"), a field programmable gate array ("FPGA"), or the like.

It should also be noted that the embodiments described herein are not limited to having a configuration of a processing device coupled to an application processor, but may include a system that measures a signal indicative of the capacitance on the sensing device and sends the raw data to a host computer where it is analyzed by an application. In effect, the processing that is done by processing device 1010 may also be done in the application processor.

Low-power touch button circuit 101 may be integrated into the IC of the processing device 1010, or alternatively, in a separate IC. Alternatively, descriptions of low-power touch button circuit 101 may be generated and compiled for incorporation into other integrated circuits. For example, behavioral level code describing the low-power touch button circuit 101, or portions thereof, may be generated using a hardware descriptive language, such as VHDL or Verilog, and stored to a machine-accessible medium (e.g., CD-ROM, hard disk, floppy disk, etc.). Furthermore, the behavioral level code may be compiled into register transfer level ("RTL") code, a netlist, or even a circuit layout and stored to a machine-accessible medium. The behavioral level code, the RTL code, the netlist, and the circuit layout may represent various levels of abstraction to describe low-power touch button circuit 101.

It should be noted that the components of electronic system 1000 may include all the components described above. Alternatively, electronic system 1000 may include some of the components described above.

In one embodiment, the electronic system 1000 is used in a tablet computer. Alternatively, the electronic device may be used in other applications, such as a notebook computer, a mobile handset, a personal data assistant ("PDA"), a keyboard, a television, a remote control, a monitor, a handheld multi-media device, a handheld media (audio and or video) player, a handheld gaming device, a signature input device for point of sale transactions, an eBook reader, global position system ("GPS") or a control panel. The embodiments described herein are not limited to touch screens or touch-sensor pads for notebook implementations, but may be used in other capacitive sensing implementations, for example, the sensing device may be a touch-sensor slider (not shown) or touch-sensor buttons (e.g., capacitance sensing buttons). In one embodiment, these sensing devices include one or more capacitive sensors or other types of capacitance-sensing circuitry. The operations described herein are not limited to notebook pointer operations, but may include other operations, such as lighting control (dimmer), volume control, graphic equalizer control, speed control, or other control operations requiring gradual or discrete adjustments. It should also be noted that these embodiments of capacitive sensing implementations may be used in conjunction with non-capacitive sensing elements, including but not limited to pick buttons, sliders (ex. display brightness and contrast), scroll-wheels, multi-media control (ex. volume, track advance, etc.) handwriting recognition, and numeric keypad operation.

Certain embodiments may be implemented as a computer program product that may include instructions stored on a machine-readable medium. These instructions may be used to program a general-purpose or special-purpose processor to perform the described operations. A machine-readable medium includes any mechanism for storing or transmitting information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory; or another type of medium suitable for storing electronic instructions.

Additionally, some embodiments may be practiced in distributed computing environments where the machine-readable medium is stored on and or executed by more than one computer system. In addition, the information transferred between computer systems may either be pulled or pushed across the communication medium connecting the computer systems.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and or alternating manner. The terms "first," "second," "third," "fourth," etc. as used herein are meant as labels to distinguish among different elements and may not necessarily have an ordinal meaning according to their numerical designation. As used herein, the term "coupled" may mean connected directly or indirectly through one or more intervening components. Any of the signals provided over various buses described herein may be time multiplexed with other signals and provided over one or more common on-die buses. Additionally, the interconnection and interfaces between circuit components or blocks may be shown as buses or as single signal lines. Each of the buses may alternatively be one or more single signal lines and each of the single signal lines may alternatively be buses.

The above description sets forth numerous specific details such as examples of specific systems, components, methods, and so forth, in order to provide an understanding of several embodiments of the present invention. It may be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

What is claimed is:

1. A system comprising:
    a communication device;
    a power supply configured to couple with the communication device;
    a control circuit coupled to the power supply and the communication device;
    a memory configured to store control information in response to the control circuit applying power from the power supply to the communication device, the control information indicating a first qualifying event;
    a capacitance sensor configured to provide a signal indicative of a presence of an object proximate to the capacitance sensor; and
    a capacitance sensing circuit configured to measure the signal, wherein the control circuit is configured to determine that the measured signal is associated with the first qualifying event stored in the memory, and in response to the determination, control a power consumption of the communication device.

2. The system of claim 1, wherein the control circuit is configured to control the power consumption of the communication device by causing the communication device to switch from operating in a first mode to operating in a second mode, wherein the communication device consumes more power in the second mode than in the first mode.

3. The system of claim 2, wherein the control circuit comprises an interrupt line coupled to the communication device, wherein the control circuit is configured to transmit an interrupt signal via the interrupt line to cause the communication device to change between a low-power mode and a wake mode.

4. The system of claim 2, further comprising a switch circuit coupled to the power supply and the control circuit, wherein responsive to the determination that the measured signal is associated with the first qualifying event, the control circuit is configured to generate a switch signal to cause the switch circuit to switch the power supply from being disconnected from the communication device to being connected to the communication device.

5. The system of claim 2, wherein the communication device is operable to communicate data with an application processor when the communication device is operating in the second mode.

6. The system of claim 2, wherein the communication device is operable to communicate data with an external computer system when the communication device is operating in the second mode, wherein the communication device is coupled to the external computer via a communication medium.

7. The system of claim 1, wherein the control information indicates a plurality of qualifying events, the plurality of qualifying events including a touch event and a timer event, wherein the touch event is the first qualifying event and the timer event is a second qualifying event.

8. The system of claim 7, wherein the control circuit is configured to determine that the second qualifying event has occurred, and in response to the determination that the second qualifying event has occurred, control the power consumption of the communication device.

9. The system of claim 1, wherein the communication device is disposed in a first integrated circuit chip and the capacitance sensing circuit is disposed in a second integrated circuit chip separate from the first integrated circuit chip.

10. A method comprising:
    storing control information in a memory in response to power being applied to a communication device;
    measuring a signal provided by a capacitance sensor, the signal indicative of a presence of an object proximate to the capacitance sensor;
    responsive to measuring the signal, accessing control information in a memory to determine whether the signal is associated with a first qualifying event of the control information; and responsive to determining that the signal is associated with the first qualifying event, controlling a power consumption of the communication device.

11. The method of claim 10, wherein the controlling of the power consumption of the communication device comprises causing the communication device to switch from operating in a first mode to operating in a second mode, wherein the communication device consumes more power in the second mode than in the first mode.

12. The method of claim 11, wherein the causing the communication device to switch from operating in the first mode to operating the second mode comprises transmitting an interrupt signal to the communication device to change between a low-power mode and a wake mode.

13. The method of claim 11, wherein the causing the communication device to switch from operating in the first mode to operating the second mode comprises causing a switch signal for a switch circuit to switch a power supply from being disconnected from the communication device to being connected to the communication device.

14. The method of claim 11 further comprising using the communication device to communicate data with an application processor when the communication device is operating in the second mode.

15. The method of claim 11 further comprising, when the communication device is operating in the second mode, coupling the communication device with an external computer system via a communication medium, and using the communication device to communicate data with the external computer system.

16. The method of claim 10 further comprising accessing control information in the memory to determine whether a second qualifying event of the control information has occurred, wherein the second qualifying event is a timer event.

17. The method of claim 16, further comprising responsive to determining that the second qualifying event has occurred, controlling the power consumption of the communication device.

18. The method of claim 10, further comprising using the communication device to load the control information into the memory.

19. An apparatus comprising:
a control circuit configured to couple with a power supply and a communication device;
a memory configured to store control information in response to the control circuit applying power from the power supply to the communication device, the control information indicating a first qualifying event;
a capacitance sensing circuit configured to measure a signal indicative of a presence of an object proximate to a capacitance sensor, wherein the control circuit is configured to determine that the measured signal is associated with the first qualifying event stored in the memory, and in response to the determination, cause a switch circuit to couple the power supply to the communication device.

20. The apparatus of claim 19, wherein when coupled to the power supply, the communication device is operable use the power supply to couple with an external computer via a communication medium and to communicate with the external computer.

* * * * *